United States Patent
Welbon et al.

(10) Patent No.: US 7,131,047 B2
(45) Date of Patent: Oct. 31, 2006

(54) TEST SYSTEM INCLUDING A TEST CIRCUIT BOARD INCLUDING RESISTIVE DEVICES

(75) Inventors: Edward Hugh Welbon, Austin, TX (US); Roy Stuart Moore, Georgetown, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 566 days.

(21) Appl. No.: 10/408,705

(22) Filed: Apr. 7, 2003

(65) Prior Publication Data

US 2004/0199844 A1    Oct. 7, 2004

(51) Int. Cl.
  *G01R 31/28* (2006.01)
  *H01C 1/012* (2006.01)
(52) U.S. Cl. .................... 714/734; 338/307
(58) Field of Classification Search ........... 714/742, 714/734, 724; 361/765, 760, 761, 766, 748; 29/846, 825, 829
See application file for complete search history.

(56) References Cited

U.S. PATENT DOCUMENTS

| | | | |
|---|---|---|---|
| 5,205,741 A | 4/1993 | Steen et al. | |
| 5,282,312 A | 2/1994 | DiStefano et al. | |
| 5,548,268 A | 8/1996 | Collins | |
| 5,603,847 A * | 2/1997 | Howard et al. | 216/17 |
| 5,654,971 A * | 8/1997 | Heitele et al. | 714/735 |
| 5,708,569 A * | 1/1998 | Howard et al. | 361/760 |
| 5,859,538 A | 1/1999 | Self | |
| 6,127,837 A | 10/2000 | Yamamoto et al. | |
| 6,255,602 B1 | 7/2001 | Evans et al. | |
| 6,462,570 B1 | 10/2002 | Price et al. | |
| 6,661,248 B1 * | 12/2003 | Mori et al. | 324/765 |
| 6,825,678 B1 | 11/2004 | Kline | |

\* cited by examiner

*Primary Examiner*—Christine T. Tu
(74) *Attorney, Agent, or Firm*—Meyertons Hood Kivlin Kowert & Goetzel, P.C.; B. Noël Kivlin; Stephen J. Curran

(57) ABSTRACT

A test system includes a device under test and a test circuit board. The device under test includes a plurality of contacts configured to provide output signals. The test circuit board may convey the output signals from the device under test to an analyzer. The test circuit board may include a dielectric layer, a via extending through the dielectric layer, a conductor formed on the dielectric layer and a resistive annular ring having a predetermined resistance value. The resistive annular ring may be formed around the via and may be electrically coupled between the via and the conductor.

17 Claims, 4 Drawing Sheets

TEST SYSTEM INCLUDING A TEST CIRCUIT BOARD INCLUDING RESISTIVE DEVICES

BACKGROUND OF THE INVENTION

1. Field of the Invention

This invention relates to test systems and, more particularly, to test circuit boards including built-in resistive devices.

2. Description of the Related Art

Circuit boards come in may different types. One common type of circuit board is a printed circuit board. Printed circuit boards generally have one or more layers of insulating or dielectric material which may be laminated together. Each layer may include multiple signal paths or "signal traces" which are used to propagate signals. In addition, some layers may be used only to provide power or ground and may be considered as a solid plane. These types of layers are typically referred to as power and ground planes, respectively. Further, other layers may include both power or ground planes as well as signal traces.

The circuit board is typically made from an insulating material such as fiberglass or similar dielectric material which may provide isolation between signal traces as well as a rigid backing for mechanical strength.

The signal traces are typically thin metallic "wires" which have been etched from a pattern which has been printed onto a metal layer which may be bonded to the surface of the circuit board. The metal is generally copper or some other similar conductive copper alloy. Depending on the type of process used to manufacture the circuit board, the unused metal may be etched away leaving the signal traces and any other metallic contact surfaces intact.

To connect signals, power and ground between layers, one or more types of "vias" may be used. Generally speaking a via is a hole that is drilled or bored through one or more layers of a circuit board. A metallic finish is plated to the inside surface of the hole, thereby enabling traces or connections on each layer to be connected. Typically, at places where a signal trace is connected to a via on a given layer, a metallic annular ring is formed to which the trace to connected. One type of via is a through-hole via. A through-hole via is typically a hole which is bored completely through all circuit board layers, thereby enabling any layer to be connected to any other layer. Another type of via is a blind via. Blind vias are typically used to connect a surface layer such as a top or bottom layer to an inner layer. Thus, a blind via may be bored through one or more layers but not completely through all layers of a circuit board. Another type of via is a buried via. Buried vias are typically used to connect internal layers of the circuit board. Thus, from either surface of the circuit board, the blind vias may be hidden.

Generally, design rules allow the traces to be routed with as much space between traces as possible. However, depending on such factors as the density of the signal traces and circuit components, signal traces and even vias may necessarily be routed relatively close together.

At high frequencies, the traces on a circuit board may act like transmission lines, thus certain trace characteristics become important when considering signal integrity. Generally, for maximum power transfer and minimum signal reflection it is important to match the impedance of the load to the impedance of the source. Depending on how well these impedances are matched may determine how much the input signal is distorted or reflected as it propagates down the trace.

In many conventional circuit boards, to match the source and load, a termination resistor may be soldered at one or both ends of a signal trace. This may be especially important when analyzing the output signals of a device. An analyzer probe connected to an output pin may cause the signal to be distorted. Accordingly, a termination resistor may be soldered between the output connection and circuit ground, for example. However, depending on the density of the traces and vias on a circuit board, it may be difficult if not impossible to place a resistor on the board. Thus to convey signals at very high frequencies on a conventional circuit board, signals may be distorted due to an impedance mismatch. Therefore, the frequency of operation of a conventional circuit board may be limited.

SUMMARY OF THE INVENTION

Various embodiments of a test system including a test circuit board including resistive devices are disclosed. In one embodiment, the test system includes a device under test and a test circuit board. The device under test includes a plurality of contacts configured to provide output signals. The test circuit board may convey the output signals from the device under test to an analyzer unit. The test circuit board may include a dielectric layer, a via extending through the dielectric layer, a conductor formed on the dielectric layer and a resistive annular ring having a predetermined resistance value. The resistive annular ring may be formed around the via and may be electrically coupled between the via and the conductor.

Figure 1:
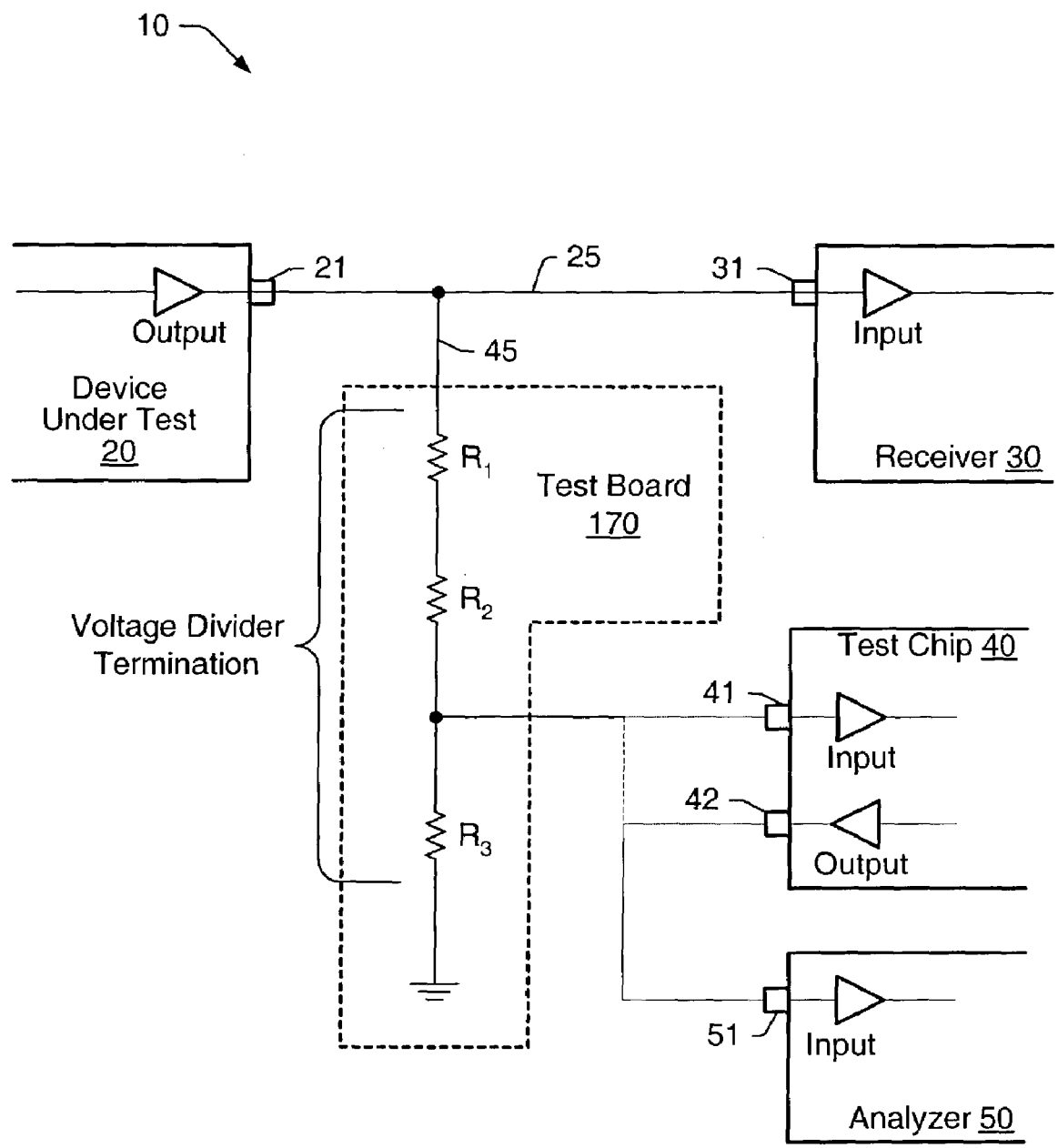
FIG. 1 is a block diagram of one embodiment of an exemplary test system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Turning now to FIG. 1, a block diagram of one embodiment of an exemplary test system is shown. Test system 10 includes a device under test (DUT) 20. DUT 20 includes an output signal contact 21 coupled to an input pin 31 of a receiver device 30 via a signal path 25. In addition, output signal contact 21 is coupled to an input signal contact 51 of analyzer 50 via a signal path 45. Signal path 45 includes resistors R1, R2 and R3. In the illustrated embodiment, resistors R1, R2 and R3 may be part of a test circuit board 170.

Depending on the frequency of the signals produced at output signal contact 21 of DUT 20, the load created by signal path 45 may cause distortion of the output signal. Accordingly, in the illustrated embodiment, resistor R1 may provide a series termination and resistors R2 and R3 may provide a voltage divider termination for signal path 45. Thus, resistors R1, R2 and R3 may be used to ameliorate any distortion caused by the stub created by signal path 45. It is noted that the wire trace between R1 and R2 may be quite long in a typical application. In such an application, R1 acts as a series damping termination resistor while R2 and R3 form a voltage divider termination. Thus, both ends of the wire trace between R1 and R2 may be terminated.

It is noted that in another embodiment, instead of conveying output signals directly to analyzer 50 through test circuit board 170, output signal contact 21 may be coupled to an input signal contact 41 of a test chip 40 via signal path 45 as illustrated by the dotted lines. Test chip 40 may then output signals on output signal contact 42 which may be conveyed to analyzer 50 through test circuit board 170.

In such an embodiment, DUT 20 may be a high performance processor, for example. During operation, DUT 20 may output signals on a variety of contacts. In one embodiment, test chip 40 may be configured to capture the output signal from output signal contact 21 and to perform some type of processing as necessary. For example, test chip 40 may coalesce the output signals from one or more output signal groups into a single output. Test chip 40 may then output the processed signals for use by analyzer 50, which may be a logic analyzer, for example. To effectively capture the output signals from DUT 20, test circuit board 170 may be used. Test chip 40 may be mounted to test circuit board 170 and outputs may be provided for connections to analyzer 50.

As will be described in greater detail below in conjunction with the descriptions of FIG. 2 through FIG. 6, test circuit board 170 may use built-in termination resistors to minimize the loading effects of conveying the output signals of DUT 20 to test circuit board 170 and analyzer 50.

Figure 2:
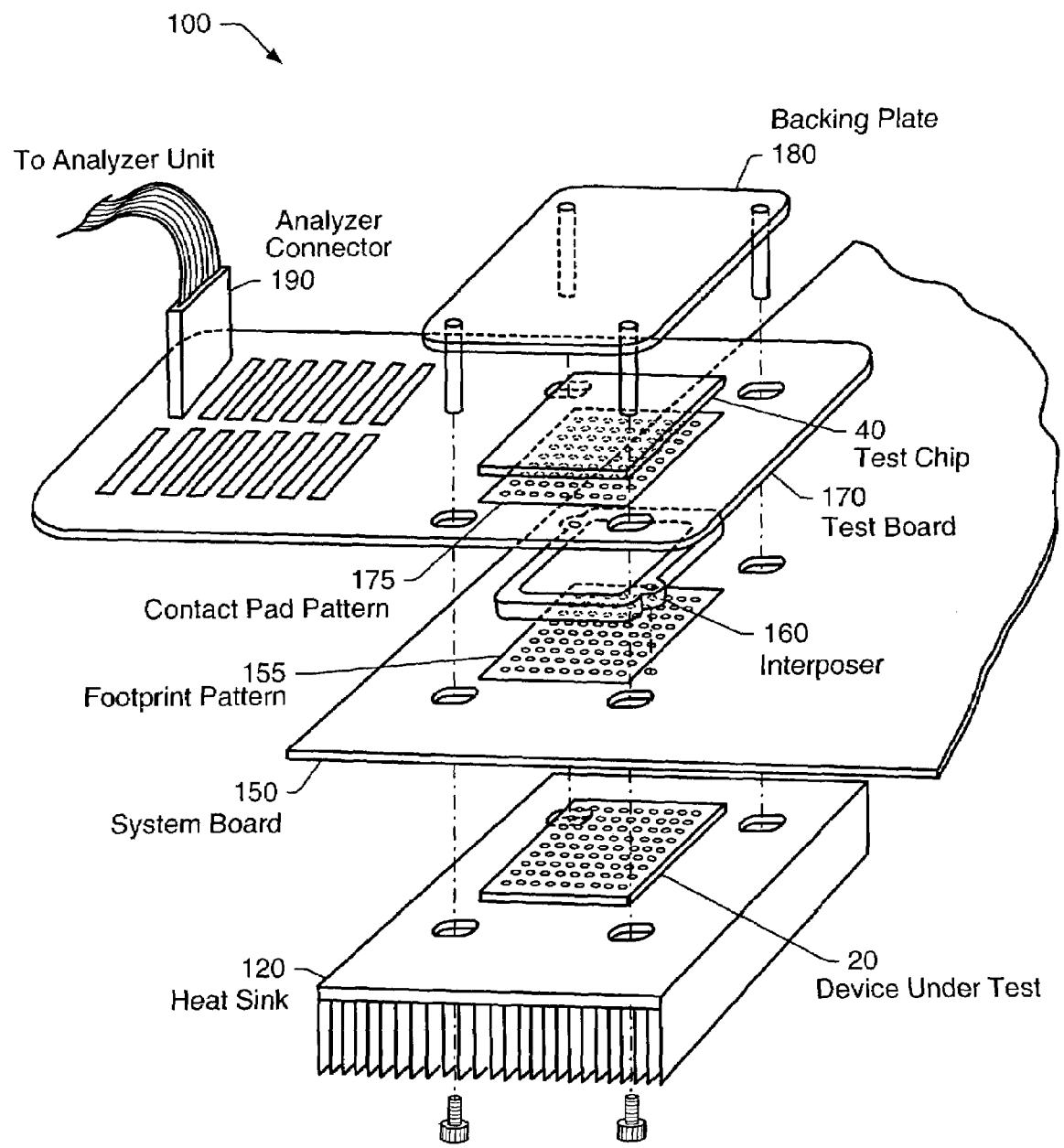
FIG. 2 is a perspective view drawing of one embodiment of the test system of FIG. 1.

Referring to FIG. 2, a perspective view drawing of one embodiment of the test system of FIG. 1 is shown. Components corresponding to those shown in FIG. 1 are numbered identically for clarity and simplicity. Test system 100 includes a device under test (DUT) 20 which may be mounted to a heat sink 120 and to a system board 150. System board 150 is coupled to a test circuit board 170 through an interposer 160. Test system 100 also includes a test integrated circuit chip 40 which is coupled to test circuit board 170. Test system 100 also includes a backing plate 180 which provides a mechanism to hold the various components together. Further, an analyzer connector 190 may be coupled to test circuit board 170 via a corresponding connector on test circuit board 170.

Backing plate 180 may be used to "sandwich" test chip 40, test circuit board 170, interposer 160, system board 150, DUT 20 and heat sink 120 together. In the illustrated embodiment, thumb-screws or other suitable fasteners may be used to fasten backing plate 180 to heat sink 120. This arrangement may compress each contact on DUT 20, interposer 160 and test chip 40 to their respective contact pads on their respective circuit boards.

In the illustrated embodiment, DUT 20 uses a ball grid array (BGA) for its contact pin-out. The BGA forms a given footprint pattern. The footprint pattern of DUT 20 is mated to a footprint pattern 155 on system board 150. Footprint pattern 155 is provided on both the top and bottom surface of system board 150. To keep lead lengths as short as possible, the footprint pattern on each board surface is symmetrically matching and also positioned opposite other. Accordingly, a footprint pattern on the bottom of interposer 160 mates to footprint pattern 155 on the top surface of system board 150. In addition, a footprint pattern on the top of interposer 160 mates to a footprint pattern on the bottom of test circuit board 170, and so forth. It is noted that although a BGA footprint pattern is used in the illustrated embodiment, other embodiments are contemplated in which other footprint patterns may be used.

In one embodiment, system board 150 may be any circuit board which is used in the normal operation of DUT 20. For example, if DUT 20 is a processor, system board 150 may be a processor motherboard. However, in other embodiments, system board 150 may be special circuit board designed to emulate a typical system environment as seen from DUT 20.

In the illustrated embodiment, interposer 160 may provide a means for conveying signals from system board 150 to test circuit board 170 while allowing clearance of other components on system board 150. In other words, interposer 160 may be a spacer which also conveys signals. As described above, interposer 160 may include a set of contacts on each side which have a footprint pattern which matches footprint pattern 155. In addition the contacts of interposer 160 may be flexible or spring loaded to provide a compression connection when mated between system board 150 and test circuit board 170.

In the illustrated embodiment, test circuit board 170 is a circuit board which provides signal paths for capturing output signals which are conveyed from DUT 20. Further, test circuit board 170 may provide signal paths for the output signals to be conveyed from test chip 40 to an analyzer unit (not shown).

It is noted that although test chip 40 is shown in the illustrated embodiment, it is contemplated that in other embodiments, test circuit board 170 may convey output signals from DUT 20 directly to analyzer connector 190 for use by an analyzer unit such as analyzer 50 of FIG. 1, for example, without the use of test chip 40.

As described above, in one embodiment, analyzer 50 may be configured to capture the transactions which occur at the interface of DUT 20. In certain implementations, it may be important that these transactions be collected contiguously and at system speeds. It may be additionally important that the acquired transactions be time-stamped. Further, it may be important for the acquired transactions to be efficiently packed in analyzer records. However, in many advanced bus structures, the buses may be broken up into smaller pieces or multiplexed such that the signal groups pertinent to a given transaction may not be output during a single clock cycle. For many analyzers, it may be difficult or impossible to coalesce the signals pertinent to the given transaction and/or to efficiently store the data.

In the illustrated embodiment, test chip 40 may be configured to capture output signals from DUT 20 and to perform pre-processing on the signals. For example, test chip 40 may coalesce multiple groups of signals which may be captured at different time intervals into single capture cycles including packed groups of signals. Test chip 40 may then output the coalesced signals for analysis by an analyzer unit (not shown in FIG. 2). As described above, test chip 40 uses a footprint pattern which mirrors footprint pattern 155.

In the illustrated test system (with and without test chip 40), providing termination resistors to acquire the output signals of DUT 20 may be problematic on a conventional test circuit board. As will be described in greater detail below in conjunction with the description of FIG. 3 through FIG. 6, termination resistors may be built into the traces and layers of test circuit board 170, thereby providing resistive termination without the added complexity of soldering surface mount resistors to a dense pin configuration such as the BGA footprint of FIG. 2.

Figure 3:
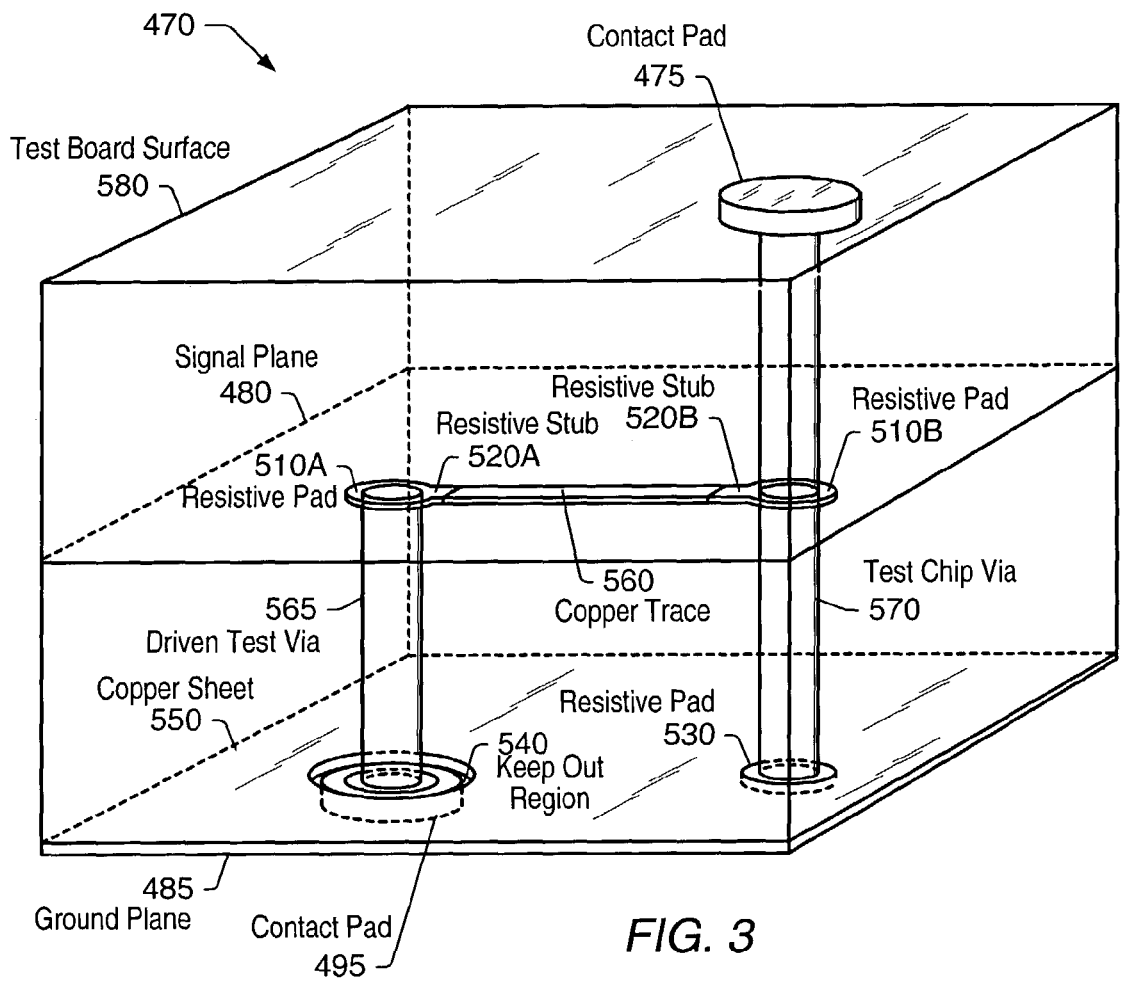
FIG. 3 is a perspective view drawing of one embodiment of a test circuit board.

Turning to FIG. 3, a perspective view drawing of one embodiment of a test circuit board is shown. Components that correspond to those shown in FIG. 2 are numbered identically for clarity and simplicity. Test circuit board 470 is a multi-layer circuit board including a test board surface 580, an internal signal plane 480 and a ground plane 485. Test board surface 580 may also be a signal plane and includes contact pad 475. Test circuit board 470 also includes a test chip via 570 and a driven test via 565. It is noted that in the illustrated embodiment, the underside of ground plane 485 is a bottom surface of test circuit board 470 and includes an additional contact pad 495. It is further noted that test chip via 570 is a through-hole via and driven test via 565 is a blind via. However, in alternative embodiments, other types of vias may be used.

As noted above, test board surface 580 may be a signal plane and may include other signal traces (not shown). In the illustrated embodiment, contact pad 475 may be a surface mount pad which provides a surface connection between test chip via 570 and a device such as test chip 40 of FIG. 2, for example.

In the illustrated embodiment, signal plane 480 includes a signal trace which is coupled between test chip via 570 and driven test via 565. The signal trace includes resistive pad 510A, resistive stub 520A, copper trace 560, resistive stub 520B, and resistive pad 510B. In one embodiment, resistive pad 510A, resistive stub 520A, resistive stub 520B, and resistive pad 510B may be a made of a resistive material such as a carbon-based polymer paste, for example. As will be described further below, the respective resistive pad and stub combinations provide a resistive termination having a predetermined resistance value which is electrically coupled to a respective via.

As described above, in the illustrated embodiment, ground plane 485 includes a copper sheet 550, although it is noted that other embodiments may use other conductive materials for the conductive surface. Ground plane 485 may serve as a circuit ground. In the illustrated embodiment, ground plane 485 also includes a resistive pad 530 which is coupled between test chip via 570 and copper sheet 550. As will be described further below, resistive pad 530 provides a resistive termination to circuit ground for a signal conveyed on test chip via 570. Ground plane 485 also includes a keep out region 540. Keep out region 540 may provide a region where no copper sheet exists. Thus, contact pad 495 and driven test via 565 do not contact copper sheet 550. Resistive pad 530 may be a made of a resistive material such as a carbon-based polymer paste, for example. In the illustrated embodiment, contact pad 495 may be a surface mount pad which provides a surface connection between driven test via 565 and a device such as device under test 20 of FIG. 2, for example.

Referring collectively now to FIG. 1 and FIG. 3. Assuming output signal contact 21 of FIG. 1 is coupled through to contact pad 495 of FIG. 3 and input contact 41 of test chip 40 of FIG. 1 were coupled to contact pad 475 of FIG. 3, an output signal would be conveyed from DUT 20 on driven test via 565. The output signal may propagate on driven test via 565 through resistive pad 510A, resistive stub 520A, copper trace 560, resistive stub 520B, and resistive pad 510B to test chip via 570. The output signal may then be coupled to input contact 41 through contact 475 and also terminated to circuit ground through resistive pad 530. Thus, signal path 45 shown in FIG. 1 may be representative of the circuit path just described. For example, resistor R1 may correspond to the combination of resistive pad 510A and resistive stub 520A. Resistor R2 may correspond to the combination of resistive pad 510B and resistive stub 520B. Resistor R3 may correspond to resistive pad 530.

As described above, termination resistors may be "built into" or formed on the circuit board signal layers as part of a pad ring surrounding a via, for example. In alternative embodiments, the resistive material may be used as part of a signal trace. As noted above, in one embodiment the resistive material may be a carbon-based resistive polymer paste used when the circuit board layers are manufactured. The paste may be hardened during processing. It is noted that in other embodiments, other suitable resistive materials may be used.

Figure 4:
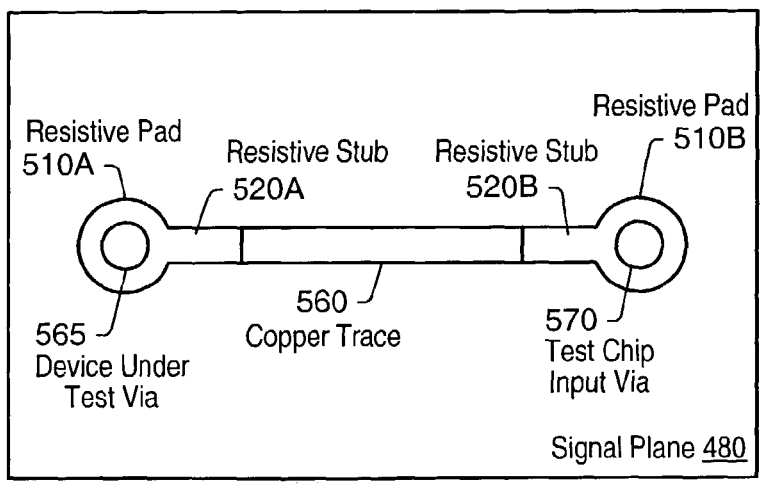
FIG. 4 is a diagram of one embodiment of a signal plane of the test circuit board of FIG. 3 including resistive devices.

Turning to FIG. 4, a diagram of one embodiment of a signal plane of the test circuit board of FIG. 3 including resistive termination devices is shown. Components that correspond to those shown in FIG. 3 are numbered identically for clarity and simplicity. Signal plane 480 illustrates a signal trace including a resistive pad 510A, resistive stub 520A, copper trace 560, resistive stub 520B, and resistive pad 510B.

The resistive pads 510A and 510B may be formed as resistive annular rings around their respective vias 565 and 570, while resistive stubs 520A and 520B may extend from the annular rings along the length of the trace for a given distance. The length of the stub may be trimmed by shortening or lengthening the stub material during processing as necessary to obtain a given pad and stub resistance. As described above, the vias are typically holes which may be bored through the board material and subsequently plated with a conductive material.

Figure 5:
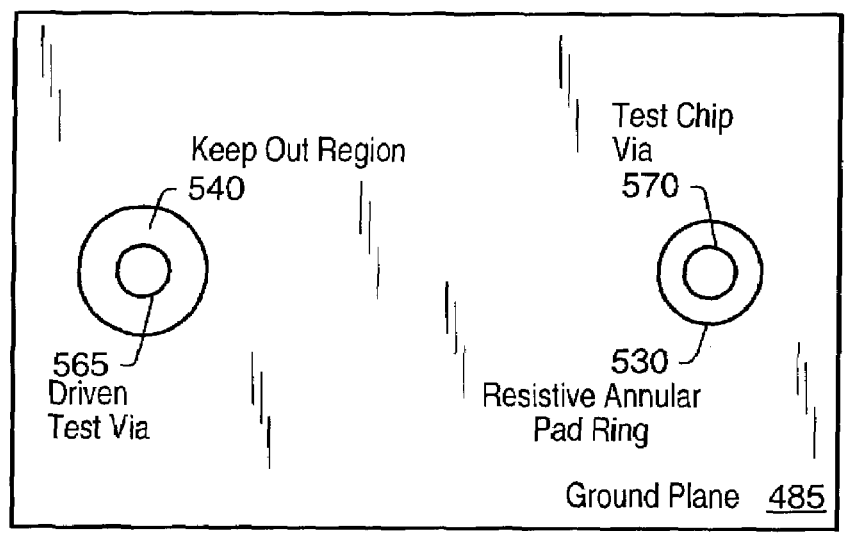
FIG. 5 is a diagram of one embodiment of a ground plane of the test circuit board of FIG. 3 including a resistive annular ring.

Referring to FIG. 5, a diagram of one embodiment of a ground plane of the test circuit board of FIG. 3 including a resistive annular pad ring is shown. Components that correspond to those shown in FIG. 3 are numbered identically for clarity and simplicity. Ground plane 485 may be a copper sheet or other conductive sheet and includes an resistive annular pad ring 530, a test chip via 570, a driven test via 565 and a keep out region 540.

As described above, resistive annular pad ring 530 may provide a termination resistance between test chip via 570 and circuit ground. Similar to resistive pads 510A and 510B, annular resistive pad ring 530 may be formed as a resistive ring around test chip via 570. It is noted that, any conductive sheet material may be removed in the region where the resistive material is placed.

Keep out region 540 is a region where any conductive sheet material is removed to allow driven test via 565 and contact pad 495 (not shown in FIG. 5) to be formed without touching circuit ground. As described above, the vias are typically holes which may be bored through the board material and subsequently plated with a conductive material.

Figure 6:
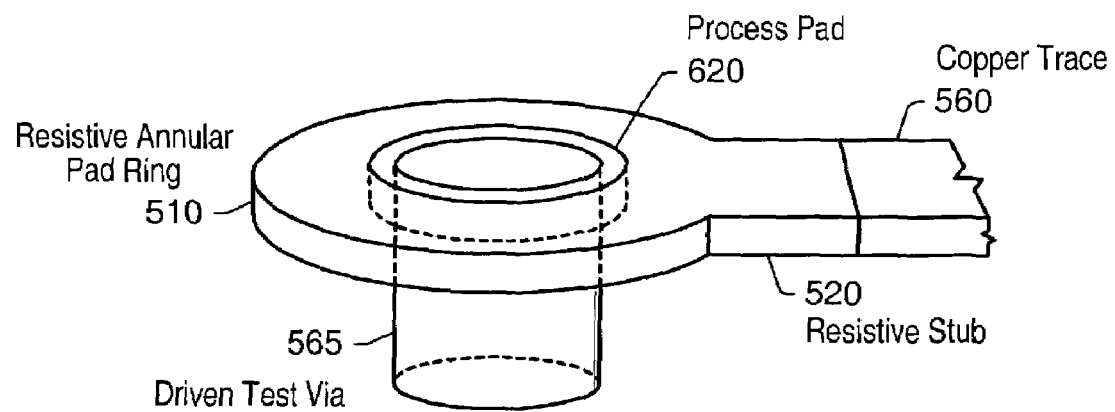
FIG. 6 is a perspective view drawing of one embodiment of the resistor of FIG. 3 and FIG. 4.

Turning to FIG. 6, a perspective view drawing of one embodiment of the termination resistor of FIG. 3 and FIG. 4 is shown. Components that correspond to those shown in FIG. 3 and FIG. 4 are numbered identically for clarity and simplicity. The termination resistor includes resistive annular pad ring 510, resistive stub 520 and process pad 620.

As described above, resistive annular pad ring 510 may be formed around a via such as driven test via 565. Resistive stub 520 may extend from annular ring 510 along the length of the trace for a given distance. In addition, a process pad 620 may be formed from conductive material such as copper to accommodate drill process variations when forming driven test via 565. It is noted that in alternative embodiments, resistive stub 520 may be omitted. It is further noted that in still other embodiments, process pad 620 may be omitted.

It is noted that although the above embodiments illustrate and describe resistive devices formed in a test circuit board, it is contemplated that the resistive devices may be formed in any circuit board irrespective of the use of the circuit board.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A test system comprising:
   a device under test including a plurality of contacts configured to provide output signals;
   a test circuit board coupled to convey said output signals from said device under test to an analyzer unit, said test circuit board comprising:
      a dielectric layer;
      a via extending through said dielectric layer;
      a conductor formed on said dielectric layer; and
      a resistive annular ring having a predetermined resistance value formed around said via and electrically coupled between said via and said conductor, wherein said resistive annular ring provides a termination resistance between a given output signal contact and a circuit ground.

2. The test system as recited in claim 1, wherein said resistive annular ring is made of a resistive material.

3. The test system as recited in claim 2, wherein said resistive annular ring further includes additional resistive material coupled between said resistive annular ring and said conductor, wherein said additional resistive material forms a resistive stub having a predetermined length.

4. The test system as recited in claim 3, wherein said predetermined resistance value is adjustable by varying said predetermined length of said resistive stub during manufacturing.

5. The test system as recited in claim 1, wherein said conductor is a signal trace.

6. The test system as recited in claim 1, wherein said conductor is a plane.

7. The test system as recited in claim 1, wherein said test circuit board further comprising a conductor forming an annular ring between said resistive annular ring and said via and formed on said dielectric layer.

8. A method of testing a device including a plurality of contacts, said method comprising:
   providing output signals from said plurality of contacts of said device;
   conveying said output signals from said device to an analyzer using a test circuit board, said test circuit board comprising:
      a dielectric layer;
      a via extending through said dielectric layer;
      a conductor formed on said dielectric layer; and
      a resistive annular ring having a predetermined resistance value formed around said via and electrically coupled between said via and said conductor, wherein said resistive annular ring provides a termination resistance between a given output signal contact and a circuit ground.

9. The method as recited in claim 8, wherein said resistive annular ring is made of a resistive material.

10. The method as recited in claim 9, wherein said resistive annular ring further includes additional resistive material coupled between said resistive annular ring and said conductor, wherein said additional resistive material forms a resistive stub having a predetermined length.

11. The method as recited in claim 10 further comprising adjusting said predetermined resistance value by varying said predetermined length of said resistive stub during manufacturing.

12. The method as recited in claim 8, wherein said conductor is a signal trace.

13. The method as recited in claim 8, wherein said conductor is a plane.

14. The method as recited in claim 8, wherein said test circuit board further comprising a conductor forming an annular ring between said resistive annular ring and said via and formed on said dielectric layer.

15. A circuit board comprising:
   a dielectric layer;
   a via extending through said dielectric layer;
   a conductor formed on said dielectric layer; and
   a resistive annular ring having a predetermined resistance value formed around said via and electrically coupled to said via; and
   additional resistive material having an additional resistance value formed between and electrically coupling said resistive annular ring and said conductor;
   wherein said additional resistive material forms a resistive stub, wherein said additional resistance value is determined by its length.

16. A test system comprising:
   a device under test including a plurality of contacts configured to provide output signals;
   a test circuit board coupled to convey said output signals from said device under test to an analyzer unit, said test circuit board comprising:
      a dielectric layer;
      a via extending through said dielectric layer;
      a conductor formed on said dielectric layer; and
      a resistive annular ring having a predetermined resistance value formed around said via and electrically coupled between said via and said conductor, wherein said resistive annular ring provides a series resistance between a given output signal contact and a corresponding one of said plurality of input signal contacts.

17. A test system comprising:
   a device under test including a plurality of contacts configured to provide output signals;
   a test circuit board coupled to convey said output signals from said device under test to an analyzer unit, said test circuit board comprising:
      a dielectric layer;
      a via extending through said dielectric layer;
      a conductor formed on said dielectric layer; and
      a resistive annular ring having a predetermined resistance value formed around said via and electrically coupled between said via and said conductor, wherein said resistive annular ring is made of a resistive material, and wherein said resistive annular ring further includes additional resistive material coupled between said resistive annular ring and said conductor, wherein said additional resistive material forms a resistive stub having a predetermined length.

* * * * *